United States Patent
Yanagisawa et al.

(10) Patent No.: US 9,553,555 B2
(45) Date of Patent: Jan. 24, 2017

(54) TERRESTRIAL BROADCAST WAVE RECEPTION-USE ANTENNA DEVICE AND COMPONENT OF SAME

(75) Inventors: Wasuke Yanagisawa, Tokyo (JP); Hirotoshi Mizuno, Tokyo (JP); Ryo Horie, Tokyo (JP); Masayo Horie, legal representative, Saitama (JP)

(73) Assignee: Yokowo Co., Ltd., Tokyo (JP)

( * ) Notice: Subject to any disclaimer, the term of this patent is extended or adjusted under 35 U.S.C. 154(b) by 548 days.

(21) Appl. No.: 13/982,433

(22) PCT Filed: Jan. 30, 2012
(Under 37 CFR 1.47)

(86) PCT No.: PCT/JP2012/051927
§ 371 (c)(1),
(2), (4) Date: Apr. 2, 2014

(87) PCT Pub. No.: WO2012/105470
PCT Pub. Date: Aug. 9, 2012

(65) Prior Publication Data
US 2014/0248846 A1 Sep. 4, 2014

(30) Foreign Application Priority Data
Jan. 31, 2011 (JP) .................. 2011-018679

(51) Int. Cl.
*H04B 1/06* (2006.01)
*H03G 3/30* (2006.01)
(Continued)

(52) U.S. Cl.
CPC ............ *H03G 3/3042* (2013.01); *H03F 3/193* (2013.01); *H03F 3/211* (2013.01); *H03F 2200/18* (2013.01);
(Continued)

(58) Field of Classification Search
None
See application file for complete search history.

(56) References Cited

U.S. PATENT DOCUMENTS 7,365,683 B2  4/2008 Park
2004/0178959 A1  9/2004 Park
(Continued)

FOREIGN PATENT DOCUMENTS

CN  101136644 A  3/2008
JP  10-215122 A  8/1998
(Continued)

OTHER PUBLICATIONS

Chinese Office Action for 201280012956.2 dated Aug. 11, 2015.
Office action for Japanese Patent Application No. 2011-018679 dated Aug. 22, 2014.

*Primary Examiner* — Lana N Le
(74) *Attorney, Agent, or Firm* — Bachman & LaPointe, PC

(57) ABSTRACT

Provided is a terrestrial broadcast wave reception-use antenna device having performance that is equivalent to or better than that of a conventional device in frequency bands at or below an FM band even if an antenna element length is shortened to approximately 55 [mm]. An amplifier (12-A) is configured so as to include a compound semiconductor HEMT for amplifying a received wave having a frequency at or below a resonant point of an antenna element (10) among received waves of the antenna element (10), the compound semiconductor HEMT having an equivalent noise resistance of 2 [Ω] or smaller for the received frequency so that a noise figure (NF) is approximately constant over a wide frequency band at or below the FM band.

11 Claims, 4 Drawing Sheets

(51) Int. Cl.
*H03F 3/193* (2006.01)
*H03F 3/21* (2006.01)
*H04B 1/18* (2006.01)

(52) U.S. Cl.
CPC ... *H03F 2200/324* (2013.01); *H03F 2200/333* (2013.01); *H03F 2200/399* (2013.01); *H03F 2200/432* (2013.01); *H04B 1/18* (2013.01)

(56) References Cited

U.S. PATENT DOCUMENTS

| | | | |
|---|---|---|---|
| 2006/0099921 A1 | 5/2006 | Hong et al. | |
| 2006/0160505 A1* | 7/2006 | Ichitsubo | H03F 3/195 455/127.1 |
| 2008/0058036 A1 | 3/2008 | Nibe | |
| 2009/0195316 A1* | 8/2009 | Park | H03F 3/193 330/277 |
| 2011/0102088 A1* | 5/2011 | Rajendran | H03F 1/223 330/277 |
| 2011/0105047 A1* | 5/2011 | Qi | H04B 1/1027 455/67.13 |
| 2011/0130179 A1* | 6/2011 | Luan | H01Q 1/243 455/575.7 |
| 2012/0149322 A1* | 6/2012 | Kuo | H04B 17/21 455/234.1 |
| 2014/0018028 A1* | 1/2014 | Lemkin | H03D 7/1441 455/269 |

FOREIGN PATENT DOCUMENTS

| | | |
|---|---|---|
| JP | 2003152427 A | 5/2003 |
| JP | 2004-282752 A | 10/2004 |
| JP | 2006135995 A | 5/2006 |
| JP | 2008-300956 A | 12/2008 |
| JP | 2010522463 A | 7/2010 |
| WO | 2008/115117 A1 | 9/2008 |

* cited by examiner

TERRESTRIAL BROADCAST WAVE RECEPTION-USE ANTENNA DEVICE AND COMPONENT OF SAME

BACKGROUND OF THE INVENTION

Field of the Invention

The present invention relates to a terrestrial broadcast wave reception-use antenna device for an AM band and an FM band for use in vehicles, for example, and to a component of the antenna device. In particular, the present invention relates to a configuration in which sufficient performance can be obtained even if a very short antenna element is used. Herein, the AM band is 0.522 [MHz] to 1.629 [MHz], and the FM band is 76 [MHz] to 90 [MHz].

Background Art

As an antenna element for receiving terrestrial broadcast waves, a telescopic rod antenna element having a height of approximately 1,000 [mm] has been widely used for a long time. When the telescopic rod antenna element is expanded, the telescopic rod antenna element operates as a resonant monopole antenna for approximately 0.25λ ("λ" is a wavelength of a working frequency. The same holds true hereinafter.) in the FM band. In addition, in the AM band, the telescopic rod antenna element operates as a non-resonant monopole antenna having an output impedance of approximately 10 [kΩ]. Therefore, it is known that the telescopic rod antenna element realizes a low reflection coefficient and operates at a high efficiency near 100 [%] for a receiver. Performance of the telescopic rod antenna element in the AM band and in the FM band has been practically employed as a reference as a terrestrial broadcast wave reception-use antenna for a long time, which is used for vehicles.

When the telescopic rod antenna elements are used for vehicles, there are many incidents of breakage because of their physical heights. Therefore, there is a potential demand for shortening the antenna element in the market. However, if the height of the antenna element is reduced, an accompanying impedance change of the antenna element and a mismatch loss with a cable and a receiver due to the impedance change are increased.

In response to the demand for shortening the antenna element, a rod antenna device was commercialized in the mid-1990s, which uses a rod helical antenna element having a height of approximately 200 [mm] (0.05 of an FM wavelength A). Japanese Patent Laid-Open No. 10-215122 proposes an example of the rod antenna device.

In the rod antenna device of Japanese Patent Laid-Open No. 10-215122, a monopole antenna element is connected to an amplifier unit including an AM/FM branching circuit, an FM matching circuit, an FM amplifier, an AM amplifier, and an AM/FM combining circuit. This amplifier unit performs an active impedance conversion of an impedance variation of the antenna element and reduces a mismatch loss between the antenna element and the receiver so as to compensate for performance degradation due to the shortening of the antenna element. In this way, because the performance degradation due to the shortening of the antenna element is compensated for by the amplifier unit, this type of antenna device has been widespread worldwide to date.

In the 2000s, without limiting to vehicles, types and the number of the antenna elements for wireless media mounted in mobile terminals were rapidly increased. Along with this, the demands of the market for shortening of each antenna element were further increased. As a result, in the market of the antenna for vehicles, there have been increased demands for reducing the height of the antenna element to approximately 55 [mm] (approximately 0.0125-fold of the FM band wavelength λ, for example).

However, performance degradation of the antenna element is conspicuous when the length of the antenna element is shortened as described above, and the technology of Japanese Patent Laid-Open No. 10-215122 cannot sufficiently compensate for the performance degradation by the amplifier unit. In particular, in the conventional technology, a large deterioration of a signal/noise (S/N) ratio occurs in the FM band. Therefore, no antenna device having a height of the antenna element of approximately 55 [mm] is widespread worldwide at present.

SUMMARY OF THE INVENTION

The problem of the conventional technology is theoretically analyzed as follows.

First, a relationship between a length of the monopole antenna element and an antenna impedance is clarified. In general, a real part R of an impedance at a power feeding point of the monopole antenna element having a height H is given as a sum ($=R_r+R_i$) of a (antenna) radiation resistance $R_r$ and an (antenna) internal loss resistance $R_i$. Among them, the radiation resistance $R_r$ can be theoretically determined by the following equation using the height H of the monopole antenna element.

$$R_r = \frac{1}{2} \times 80 \bar{I}^2 \left(\frac{2\pi H}{\lambda}\right)^2 \quad [\text{Math. 1}]$$

In this equation, λ represents a wavelength (when the internal loss resistance can be sufficiently neglected).

I bar stands for an average current obtained by normalizing an average current on the monopole antenna element by a supplied current and has a value in a range of 0.5 to 1.0 theoretically in accordance with a difference of a distribution form. I bar is 0.5 for a non-resonant antenna and is approximately 0.64 for a 0.25λ resonant antenna, and I bar is in a range of 0.5 to 0.64 for almost all monopole antenna elements. A performance difference caused by a difference of the average current is limited.

In calculating characteristics of three types of monopole antenna elements having heights of 0.25λ, 0.05λ, and 0.0125λ in the FM band from the above equation, the radiation resistances $R_r$ result in 40, 1.6, and 0.1, respectively. It is understood that the radiation resistance $R_r$ is significantly reduced along with an increase of shortening degree (calculated supposing that I bar is approximately 0.64).

The internal loss resistance $R_i$ is determined by the material, structure, manufacturing condition, and the like of the monopole antenna element. It is possible to realize a small value to some extent by optimization design, but a method of realizing the value of zero at room temperature is not known at present. Therefore, in particular, the shortening of the monopole antenna element causes lowering of an antenna efficiency η indicating a power ratio between input and output of the antenna (that is substantially $R_r/(R_r+R_i)$). Supposing that the internal loss resistance $R_i$ is approximately 1.5 [Ω], the antenna efficiency η in the FM band for three types of monopole antenna elements each having heights of 0.25λ, 0.05λ, and 0.0125λ are calculated as approximately 0 [dB], −3 [dB], and −12 [dB], respectively.

On the other hand, a variation width ΔX of an imaginary part of the impedance Z (=R+jX) of the monopole antenna element having the height H resonated in the FM band with respect to a desired reception frequency band Δf is approximately given by the following equation, where f represents a working frequency, and a wavelength thereof is λ.

$$\Delta X = 4R_r \times \frac{\left(\frac{2\pi H}{\lambda}\right)^2 + 1}{\left(\frac{2\pi H}{\lambda}\right)^3} \times \frac{\Delta f}{f} \qquad \text{[Math. 2]}$$

In calculating characteristics of the three types of monopole antenna elements having heights of 0.25λ, 0.05λ, and 0.0125λ in the FM band from the above equation, the results of ΔX are 24, 38, and 142, respectively. It is understood that ΔX is significantly increased along with an increase of the shortening degree.

In addition, supposing that the impedance is selected to be $R_r$ (complete matching in the center of the band), a ratio of ΔX to $R_r$ results in 0.6, 24, and 1,400, respectively. It is understood that the change is further increased, and that significant mismatch losses are generated at both ends of the desired band due to the shortening.

Further, according to measurement by the inventors of the present invention, reflection coefficients (VSWR) were 2 or smaller, 10 or larger, and 100 or larger, respectively for the three types of monopole antenna elements having heights of 0.25λ, 0.05λ, and 0.0125λ. It was found that a large mismatch loss of a signal power reaching the receiver is inevitable due to the shortening of the monopole antenna element. In this way, if the monopole antenna element is shortened, there are problems of inevitable reduction of the antenna efficiency, narrowing of the frequency band, and mismatch loss.

In view of the problems described above, it is a principal object of the present invention to provide a terrestrial broadcast wave reception-use antenna device having performance equivalent to or better than that of the conventional device in frequency bands at or below the FM band, even if an antenna element length is shortened to approximately 55 [mm], and provide a component of the antenna device.

In order to solve the above-mentioned problems, the present invention provides a terrestrial broadcast wave reception-use amplifier and a terrestrial broadcast wave reception-use antenna device.

The terrestrial broadcast wave reception-use amplifier according to the present invention includes: a power feeding terminal for connecting to a power feeding point of an antenna element for receiving a terrestrial broadcast wave using a frequency at or below an FM broadcast band; and a compound semiconductor HEMT for amplifying a received wave having a frequency at or below a resonant point of the antenna element among received waves of the antenna element input through the power feeding terminal, the compound semiconductor HEMT having an equivalent noise resistance of 2 [Ω] or smaller for the received frequency.

In the terrestrial broadcast wave reception-use amplifier configured as described above, even if performance (such as a signal to noise ratio or a gain of a reception system) is deteriorated due to the shortening of a height (length) of the antenna element, for example, the deterioration can be compensated for by the compound semiconductor HEMT having the equivalent noise resistance of 2 [Ω] or smaller.

Therefore, even if a monopole antenna element having a length of 0.0125-fold of a wavelength of a FM broadcast band terrestrial broadcast wave or shorter is used, for example, practical performance can be realized.

It is preferred that the compound semiconductor HEMT forms a center of at least one equal noise figure circle coinciding with an impedance at a center of a curvature circle drawn by a complex impedance in a frequency band that is receivable by the monopole antenna element on a Smith chart. Thus, uniform noise can be maintained over the entire desired frequency band.

In one embodiment, a source of the compound semiconductor HEMT is connected to a ground, and a gate of the compound semiconductor HEMT is supplied with a received wave received by the monopole antenna element via a line having a predetermined impedance and a bias power via a DC blocking circuit and a bias circuit.

In another embodiment, a source of the compound semiconductor HEMT is connected to a ground, a gate of the compound semiconductor HEMT is connected to the power feeding terminal via a line having an impedance of 200 [Ω] or larger, which is lower than an output impedance of the monopole antenna element, and the gate is supplied with a bias power via a DC blocking circuit and a bias circuit.

In another embodiment, a drain of the compound semiconductor HEMT is connected to at least one of a first circuit for causing the compound semiconductor HEMT to amplify a received wave having a frequency of an AM band and a second circuit for causing the compound semiconductor HEMT to amplify a received wave having a frequency of an FM band. Thus, terrestrial broadcasting of both the AM band and the FM band can be received by using a single amplifier.

A terrestrial broadcast wave reception-use antenna device according to the present invention includes: an antenna element for receiving a terrestrial broadcast wave using a frequency at or below an FM broadcast band; an amplifier for amplifying a received wave having a frequency at or below a resonant point of the antenna element among received waves of the antenna element; and a ground terminal for connecting a ground line of the amplifier to an external ground conductive surface, in which the amplifier includes a compound semiconductor HEMT having an equivalent noise resistance of 2 [Ω] or smaller disposed at a first stage, for amplifying the received wave having the frequency at or below the resonant point.

The amplifier forms a center of at least one equal noise figure circle coinciding with an impedance at a center of a curvature circle drawn by a complex impedance in a frequency band that is receivable by the antenna element having a length of 0.0125-fold of a wavelength of the terrestrial broadcast wave of the FM broadcast band or shorter on a Smith chart.

In one embodiment, the amplifier of the terrestrial broadcast wave reception-use antenna device is configured so that all electric components are mounted on one side of a wiring board, and a ground plate is disposed on a surface of the wiring board on which no component is mounted. Thus, a low profile antenna device can be realized and is expected to be mounted on a mobile body such as a vehicle in a facilitated manner.

According to the present invention, because the HEMT of the amplifier compensates for performance degradation, particularly degradation concerning noise performance caused by shortening of the antenna element, it is possible to obtain the particular effect in which a constant signal to noise characteristic can be obtained over the entire desired frequency band, even if the height (length) of the antenna element is reduced to a length that cannot be hitherto expected.

DESCRIPTION OF THE PREFERRED EMBODIMENT

In the following, an embodiment of the present invention is described, in which the present invention is applied to a terrestrial broadcast wave reception-use antenna device that receives and amplifies terrestrial broadcasting of an AM band (0.522 [MHz] to 1.629 [MHz]) and an FM band (76 [MHz] to 90 [MHz]), in particular, to an antenna device that can be mounted to a vehicle.

[Configuration]

Figure 1:
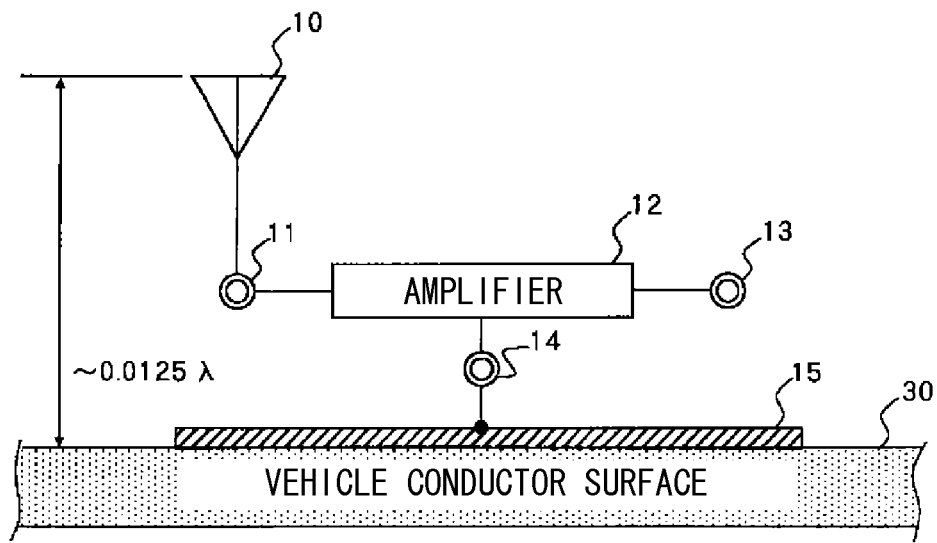
FIG. 1 is a general configuration diagram of an antenna device to which the present invention is applied.

FIG. 1 is a general configuration diagram of the antenna device according to this embodiment.

This antenna device includes an antenna element 10, a power feeding terminal 11 for connecting to the antenna element 10, an amplifier 12, an output terminal 13 for transmitting an output of the amplifier 12 to an external receiver or the like, and a ground terminal 14 for connecting a ground line of the amplifier 12 to a ground plate 15. The ground plate 15 is affixed to a vehicle conductor surface 30, and hence the ground plate 15 and the vehicle conductor surface 30 serve as ground surface for the antenna element 10.

The antenna element 10 is a rod helical coil in which a copper wire having a diameter of 0.4 [mm] for example is wound approximately 100 turns to a winding diameter of 6 [mm]. The antenna element 10 is designed so that a distal end thereof is positioned at approximately 30 [mm] to 55 [mm] from the vehicle conductor surface 30, namely at a height of 0.0125λ for a working frequency of the FM band (75 [MHz]). However, the antenna element 10 is not limited to the example described above. For instance, it is possible to adopt a structure in which a plate-shaped electrode having a height of 0.0125λ (approximately 55 [mm]) made of a copper foil having a thickness of 0.1 [mm], a width of 10 [mm], and a length of 55 [mm] is disposed substantially parallel to the vehicle conductor surface 30, and a coil in which a copper wire having a diameter of 0.3 [mm] to 0.8 [mm] for example is wound 10 to 20 turns to an appropriate winding diameter is disposed between the plate-shaped electrode and the power feeding terminal 11.

The antenna element 10 having this configuration receives terrestrial broadcasting of an AM band or an FM band for example and outputs the received wave to the power feeding terminal 11 at a constant antenna efficiency. When the amplifier 12 is connected to the power feeding terminal 11, a resonant point of the antenna element 10 is generated at a frequency slightly higher than a desired reception frequency band, for example, at a frequency higher than the upper end of the FM band by 0 [%] to 1 [%]. Thus, the amplifier 12 amplifies the received wave having a frequency at or below a resonant point of the antenna element 10 among received waves of the antenna element 10 input through the power feeding terminal 11.

Figure 2:
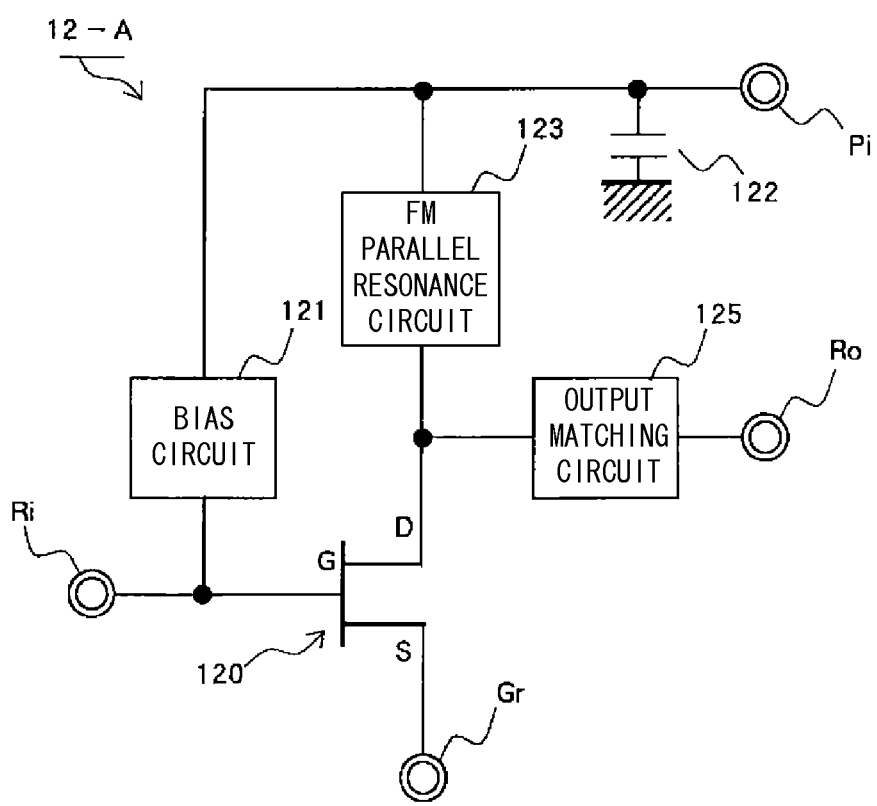
FIG. 2 is a diagram illustrating a configuration example of an amplifier included in the antenna device.
Figure 3:
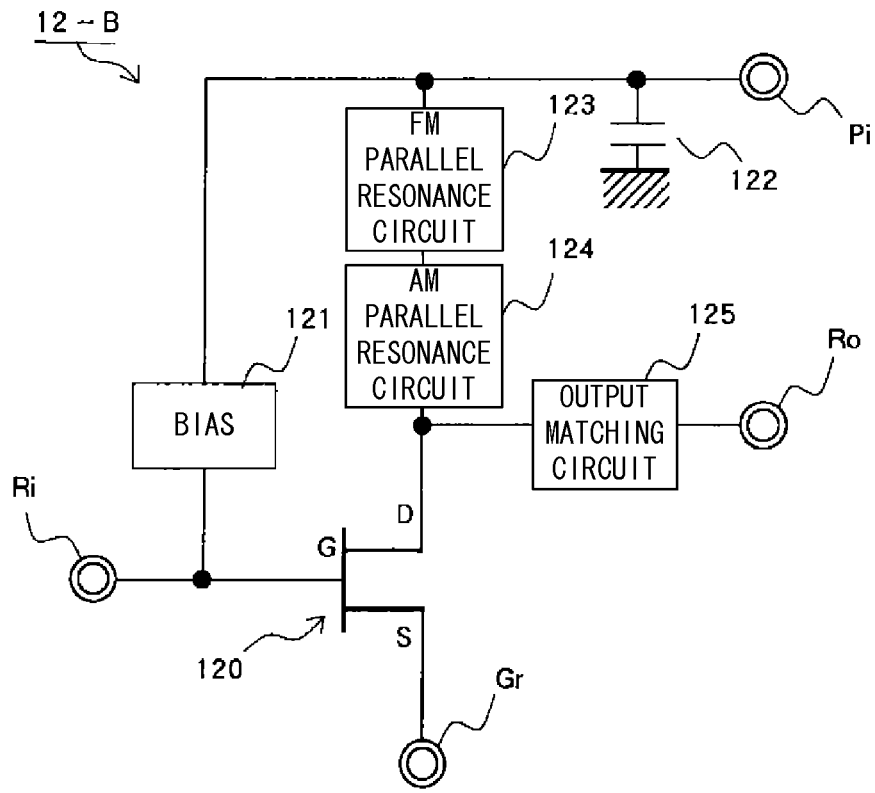
FIG. 3 is a diagram illustrating another configuration example of the amplifier included in the antenna device.
Figure 4:
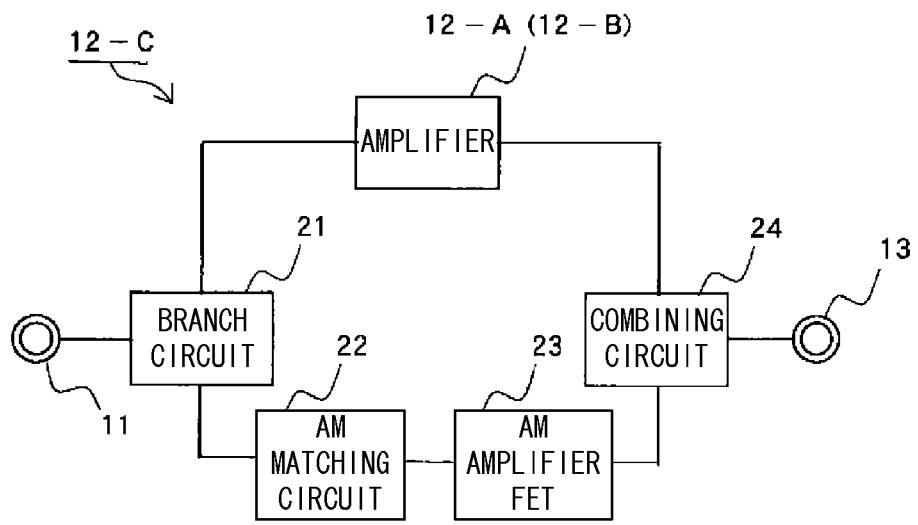
FIG. 4 is a diagram illustrating another configuration example of the amplifier included in the antenna device.

The amplifier 12 can be configured as illustrated in FIGS. 2 to 4, for example. The diagrams are the same in that a high electron mobility transistor (HEMT) made of compound semiconductor such as GaAs, InP, GaN, or SiGe, namely a field effect transistor (FET) in which high mobility two-dimensional electron gas induced in a semiconductor heterojunction is a channel is used as a first stage amplifier element. The HEMT has an equivalent noise resistance of 2 [Ω] or smaller.

The HEMT is usually used in a receiver for digital terrestrial broadcasting (470 [MHz] to 710 [MHz]) or an amplifier for a high frequency apparatus for amplifying a microwave band signal and has not been used for the AM band or the FM band hitherto. The reason for this is considered to be that performance to effect of adopting the HEMT for the AM band or the FM band is low, and that it is difficult to handle the HEMT in this low frequency band.

In other words, in a received wave of the AM band or the FM band in which thermal noise is inherently superimposed on the signal power, even if the HEMT is adopted, significant improvement of the performance cannot be obtained. Therefore, when the HEMT is used in the AM band or the FM band, an amplifying ability of approximately 100-fold becomes excessive. Then, a design and production technology considering circuit and component operations, directivity of a radiator, and the like over a 100-fold frequency wide range cause extra burden. In addition, compared with a silicon bipolar transistor, the compound semiconductor material is expensive, and a finer pattern rule is required for forming patterns on a substrate. Therefore, manufacturing cost becomes higher. In addition, compared with an element designed to mainly operate at a lower working frequency such as the AM band or the FM band than a frequency of the microwave, the pattern rule becomes excessively fine so as to be vulnerable to an electric stress.

In an amplifier 12-A illustrated in FIG. 2, a gate G of an enhancement type HEMT 120 whose source is connected to the ground is supplied with a received wave that is received by the antenna element 10 and input via the power feeding terminal 11 and an amplifier input terminal Ri, and a positive bias power supplied from a power source terminal Pi via a DC blocking circuit 122 and a bias circuit 121 in a superimposed manner.

Because an impedance of the antenna element 10 is very high, a width of a wiring line connecting the power feeding terminal 11 and the amplifier input terminal Ri to the gate G of the HEMT 120 is restricted to have a high impedance of 200 [Ω] or larger (preferably 1 [kΩ] or larger).

Further, a clearance may be provided to the ground plate 15 so that the line from the gate G of the HEMT 120 to the amplifier input terminal Ri can be set apart from the ground plate 15, or another substrate different from that of the electronic component such as the HEMT 120 may be disposed substantially perpendicular to the ground plate 15.

The source S of the HEMT 120 is connected to a ground terminal Gr on the amplifier side that is conductive to the ground terminal 14. A drain (load side) D of the HEMT 120 is connected to one end of an FM parallel resonance circuit 123 and an output matching circuit 125. The other end of the FM parallel resonance circuit 123 is connected to the power source terminal Pi. The output matching circuit 125 is used for output matching with an external receiver or the like that is connected to the output terminal 13 via an amplifier output terminal Ro.

An amplifier 12-B illustrated in FIG. 3 has a configuration in which an AM parallel resonance circuit 124 as well as the FM parallel resonance circuit 123 is added to the drain (load side) D of the HEMT 120 in the amplifier 12-A illustrated in FIG. 2. Thus, the amplifier 12-B can amplify received waves of the AM band and the FM band simultaneously.

An amplifier 12-C illustrated in FIG. 4 amplifies the AM band and the FM band separately. In other words, the received wave obtained via the power feeding terminal 11 is separated into two by a branch circuit 21, the amplifier 12-A illustrated in FIG. 2 is inserted into one branch path, an AM matching circuit 22 and an AM band amplifier 23 are inserted into the other branch path, and outputs of both the amplifiers 12-A and 23 are combined by a combining circuit 24 so as to be delivered to the output terminal 13.

Similarly to FIGS. 2 and 3, in a first stage of the AM band amplifier 23, there is disposed an enhancement type HEMT whose source is connected to the ground as a first stage amplifier element, and the received wave of the AM band is input to a gate of the HEMT.

In the amplifiers 12-A, 12-B, and 12-C, all the electronic components constituting the amplifiers are mounted on one side of a substrate having a predetermined size (on a surface in a direction of the height of the antenna element 10), and a surface of the substrate on which no component is mounted is held in intimate contact with the ground plate 15 so as to have a low profile.

The amplifiers 12-A, 12-B, and 12-C having the configuration described above do not operate from a viewpoint of pursuing gain matching with the antenna element 10 but operate so that a noise figure (hereinafter referred to as "NF") in connection to the antenna element 10 becomes approximately constant over the entire desired frequency band of the AM band and the FM band. The reason is described below.

Here, a case where the antenna element 10 having a height of approximately 55 [mm] and the amplifier 12-A are connected each other so as to receive a broadcast wave in the FM band is described. In addition, for convenience of description, a Smith chart normalized by 50 [Ω] is used for description. In the Smith chart, a horizontal axis is a real part while a vertical axis is an imaginary part of a complex reflection coefficient. An outermost periphery corresponds to total reflection.

(1) Consideration of Antenna Element 10

An impedance of the antenna element 10 is distributed in a scattered manner over a wide range in the working frequency band. Therefore, it is substantially impossible to match the impedance of the antenna element 10 with an impedance of the amplifier 12-A at a substantially fixed NF minimum point over the entire desired band. For instance, if a general method such as matching at the middle of the band is used, mismatching at both ends of the band is rapidly increased so that significant deterioration of the NF cannot be avoided.

Figure 5:
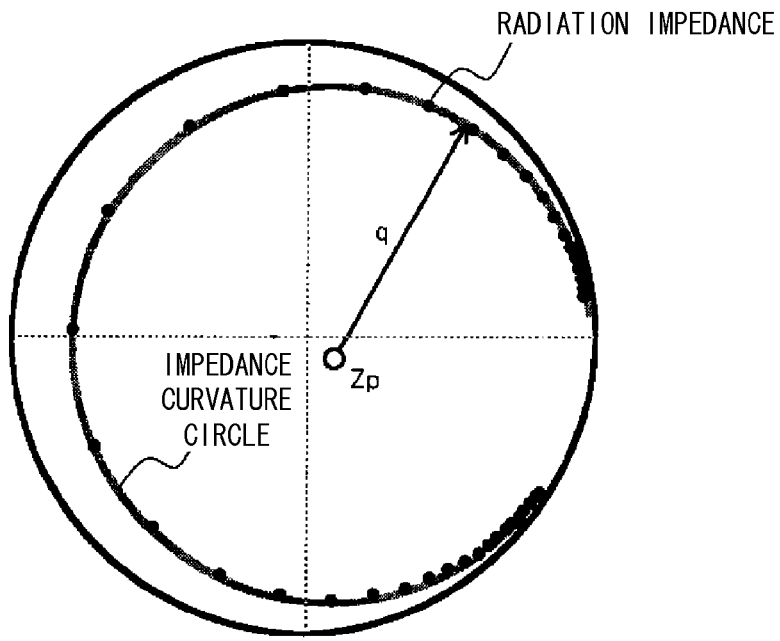
FIG. 5 is an explanatory diagram of a radiation impedance curvature circle of an FM band in a Smith chart.

The inventors of the present invention have found the following fact as a start point of the present invention. Supposing a curvature circle (referred to as an "impedance circle" for convenience sake) having a radius q of an impedance distance from a point $Z_p$ of a complex impedance in a certain state in the Smith chart (schematic diagram) illustrated in FIG. 5, there is only one impedance circle overlapping with the impedance of the antenna element 10 operating as a radiator (referred to as a "radiation impedance" for convenience sake) depending on a combination of $Z_p$ and q. It is a matter of fact that this complex impedance $Z_p$ has the same impedance distance from every point on the radiation impedance. In the description of this specification, the impedance circle satisfying this condition is expressed as a "radiation impedance curvature circle", and the center thereof is expressed as a "center of the radiation impedance curvature circle" for convenience sake.

Further, the impedance distance can be considered to have the same meaning as an impedance matching degree.

For instance, an impedance distance between a point A of an impedance $Z_a$ ($=R_a+jX_a$) and a point B of an impedance $Z_b$ ($=R_b+jX_b$) is $|Z_a-Z_b|$. As this distance becomes larger, the point B is farther from the point A on the Smith chart so that the point B is more mismatched with the point A. Here, a set of dots having an impedance distance q ($=R_a+jX_a-R_b-jX_b|=\sqrt{((R_a-R_b)^2+(X_a-X_b)^2)}$) from the point A is supposed. Then, this set is a circle having its center at the point A and a diameter q. This circle can be said to be a set of dots having the same mismatching degree (reflection coefficient) with respect to the point A.

(2) Impedance in Amplifier and its Associated Quantities

Here, an impedance having a particular meaning as an attribute of an amplifier and its associated quantities are defined as follows.

$Z_o$: reference impedance of a measurement system (50 [Ω] in this embodiment)

$G_{opt}$: complex conjugate point of an amplifier input impedance, and also optimum gain point $\Gamma_{opt}$: optimum NF point $F_{min}$: NF at $\Gamma_{opt}$ $\Gamma_N$: equal NF circle $\Omega_N$: center of $\Gamma_N$ $R_N$: radius of $\Gamma_N$ $F_N$: NF on $\Gamma_N$ N: parameter that specifies $\Gamma_N$ $R_n$: input equivalent noise resistance of the amplifier $r_n$: normalized input equivalent noise resistance of the amplifier The above-mentioned associated quantities have the following theoretical relationships.

NF of the amplifier 12-A is $(S/N)_{in}/(S/N)_{out}$, where $(S/N)_{in}$ represents a signal (S) to noise (N) ratio on an input side of the amplifier 12-A, and $(S/N)_{out}$ represents a signal to noise ratio on an output side of the amplifier 12-A.

When $G_{opt}$, $\Gamma_{opt}$, $\Gamma_{min}$, and $R_n$ are given (by manufacturers of the amplifier) as characteristic values of the amplifier, $\Omega_N$, $R_N$, $F_N$, and $r_n$ are respectively calculated as follows.

$$\Omega_N = \Gamma_{opt}/(1+N)$$

$$R_N = \sqrt{[N^2+N(1-|\Gamma_{opt}|^2)]}/(1+N)$$

$$F_N = F_{min} + 4r_n N/(|1+\Gamma_{opt}|^2)$$

$$r_n = R_n/Z_o$$

On the basis of these calculation results, an equal NF circle $\Gamma_N$ can be drawn on the Smith chart. A parameter N is a positive real number specifying a so-called contour line on the Smith chart. Zero of the parameter N corresponds to $F_{min}$, and infinity of the parameter N corresponds to a maximum NF circle (total reflection circle). N can be determined as follows.

$$\Omega_N = \Gamma_{opt}/(1+N) = Z_p$$

$$N = (\Gamma_{opt}/Z_p) - 1$$

Here, a center of the equal NF circle when N=0 is the optimum NF point $\Gamma_{opt}$, and its radius $R_N$ is also zero.

(3) Relationship Between Radiation Impedance and Equal NF Circle

Figure 6:
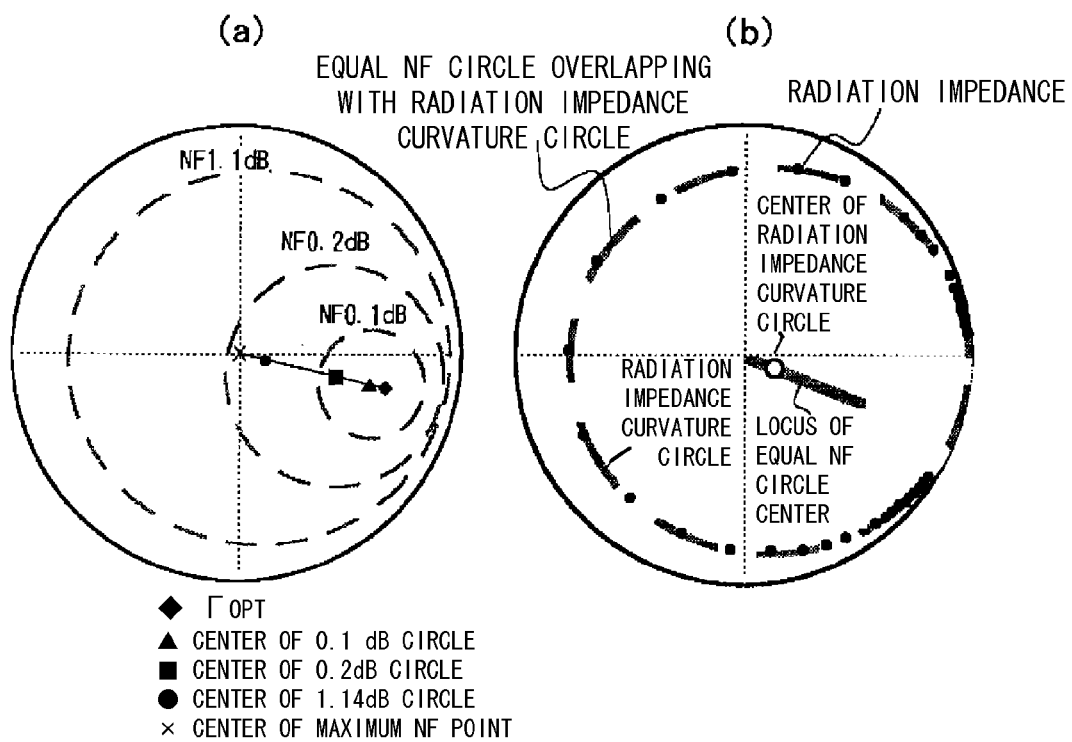
FIG. 6(a) is an explanatory diagram of an equal NF (noise figure) circle and a locus of a center of the equal NF circle of the amplifier in the Smith chart.
FIG. 6(b) is a diagram illustrating a relationship between a radiation impedance of an antenna element and the equal NF circle of the amplifier.

The center of the equal NF circle of the amplifier 12-A moves on a straight line connecting the optimum NF point $\Gamma_{opt}$ and a center of the maximum NF circle (outermost periphery of the Smith chart) as illustrated in FIG. 6 (*a*) in accordance with a variation of the parameter N. FIG. 6(*b*) illustrates a locus of this center of the equal NF circle.

As illustrated in FIG. 6(*b*), if the amplifier 12-A has a configuration in which an angle between a center of the radiation impedance curvature circle and a center of the maximum NF circle is the same as an angle of a linear locus of the center of the equal NF circle in the desired frequency band, or if a locus of the center of the equal NF circle in the desired frequency band is the same as that of the amplifier 12-A having the optimum NF point $\Gamma_{opt}$ including an impedance $Z_o$ of the center of the radiation impedance curvature circle of the antenna element 10, there is always the equal NF circle overlapping with the radiation impedance curvature circle of the antenna element 10. In this case, the amplifier 12-A becomes the equal NF at every point in the desired frequency band.

The NF of the equal NF circle overlapping with the radiation impedance curvature circle is determined by an amplifier element in the amplifier 12-A, namely by an equivalent noise resistance $R_n$ in the input of the HEMT 120.

For instance, it is supposed that the HEMT 120 is used which has an equivalent noise resistance of 2 [Ω], a reference impedance $Z_o$=50 [Ω], $R_n$=2 [Ω], $F_{min}$=0.08 [dB], and $\Gamma_{opt}$=0.68−0.16j, and that the parameter N is selected to be "5". Then, the NF of the equal NF circle becomes approximately 1.1 [dB] (see FIG. 6(*a*)). Therefore, it is understood that the equivalent noise resistance $R_n$ in the input of the HEMT 120 is practically preferred to be 2 [Ω] or smaller.

(4) Usefulness of HEMT

Figure 7:
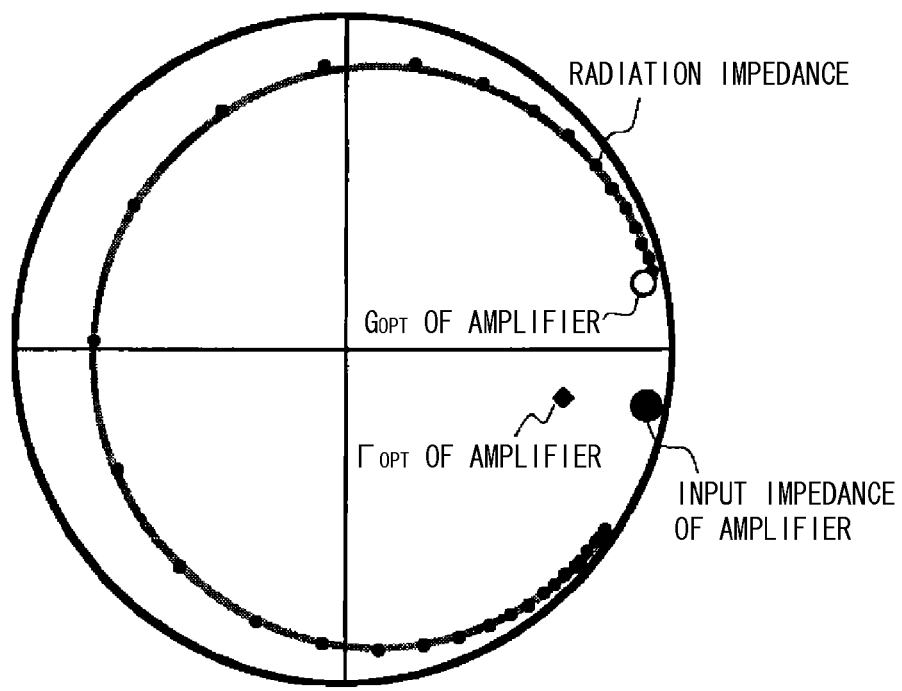
FIG. 7 is a diagram illustrating a relationship between the antenna element and a gain of the amplifier in the Smith chart.

It should be noted that the input impedance and a gain matching point of the amplifier 12-A are significantly apart from the radiation impedance of the antenna element 10 as illustrated in FIG. 7, and a gain mismatch loss in an operating state is up to −25 [dB] at most. In other words, the antenna element 10 having a height reduced to 55 [mm] as in this embodiment has an arrangement losing its antenna effective height and basically acts so as to deteriorate a gain of the amplifier 12-A. In addition, because the amplifier 12-A amplifies the received wave having a frequency at or below a resonant point of the antenna element 10, the gain is deteriorated more than in the case where the resonant point is near the center of the frequency band.

However, even in this state, the antenna device 10 of this embodiment is configured to maintain a practical NF over the entire FM band. One of the reasons of this is as follows. The pursuit of gain matching with the impedance conventionally performed in general is abandoned, and instead the antenna element 10 and the amplifier 12-A are connected in a manner that a constant noise characteristic is obtained over the entire FM band. In addition, the deterioration of the gain or the like caused by shortening of the antenna element 10 is compensated for by the HEMT 120 of the amplifier 12-A (to be low noise).

(5) Confirmation

It is confirmed what degree of characteristic the antenna device of this embodiment can obtain in relationship with the conventional antenna device used in the same frequency region.

In the confirmation, a constant transmission power set to be an appropriate reception range was supplied to antenna devices to be evaluated in an electromagnetic anechoic chamber. The antenna devices to be evaluated were a first antenna device including an antenna element of 200 [mm] and a conventional amplifier without the HEMT 120, a second antenna device in which only the antenna element was shortened to 55 [mm], and an antenna device of this embodiment (third antenna device).

The received wave received and amplified by these devices was input to a spectrum analyzer so that a signal power (S) and a noise power (N) were each measured. The noise power was measured in a state where the transmission was stopped. After that, the signal power (S) was divided by the noise power (N) so that the S/N was determined. The result is shown in FIG. 8.

Figure 8:
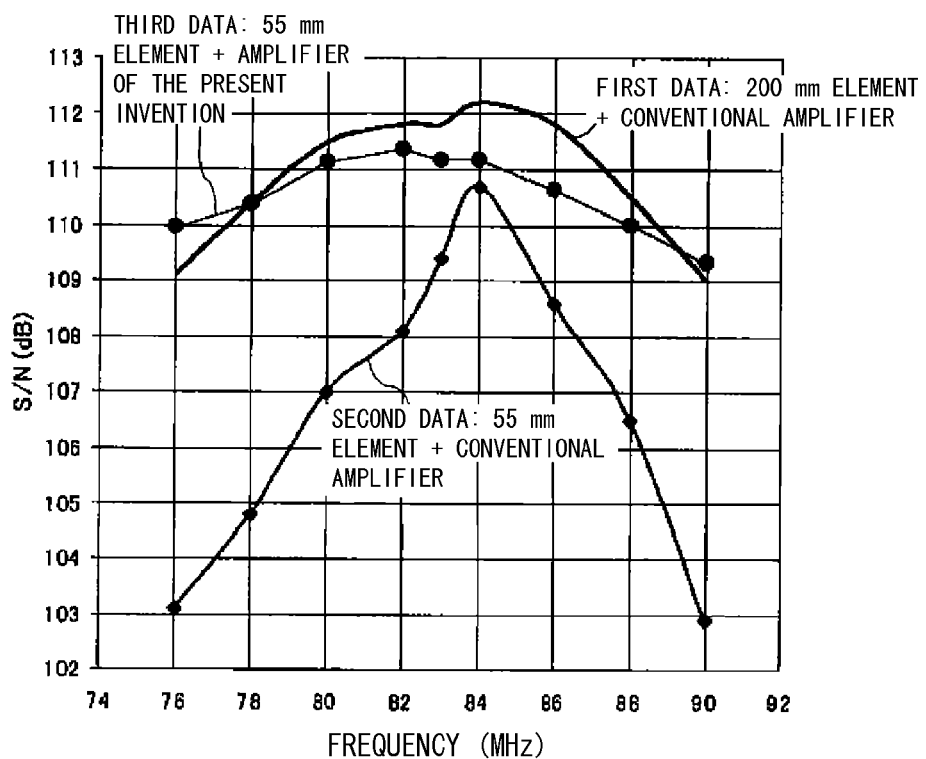
FIG. 8 is a measurement graph showing an evaluation example of the antenna device of an embodiment.

In FIG. 8, a first data indicates a typical performance example in the first antenna device. This value is a target value at a performance achievement level (industry standard performance), and many antenna device manufacturers are conducting development so as to catch up with this performance.

A second data is data generated by the second antenna device. A third data is data generated by the antenna device of this embodiment. The third data is significantly improved at both ends of the band compared with the second data and is close to the first data.

In other words, it is confirmed that the S/N close to the industry standard performance is realized by the antenna element 10 having a length of approximately 0.0125λ, which has been impossible to realize in the conventional technology, as an antenna device for the FM band terrestrial broadcasting.

Note that, the above description is an example of the antenna device using the amplifier 12-A of FIG. 2, but the present invention can be applied also to the antenna device using the amplifier 12-B of FIG. 3 or the amplifier 12-C of FIG. 4. In particular, the antenna device using the amplifier 12-B of FIG. 3 has an advantage that terrestrial broadcast waves of the AM band and the FM band can be received by a single antenna device, and the amplifier 12-C of FIG. 4 has an advantage that the amplifier 12-C can be realized only by replacing a part of the conventional antenna device with the amplifier 12-A.

In addition, this embodiment describes an example where the broadcast wave of the FM band is received, but it is confirmed that the practical performance can be sufficiently exerted also in the AM band from the confirmation by the inventors of the present invention.

In addition, the above description is based on consideration that the device is mounted on a vehicle, but the antenna device of the present invention can be widely used in any field such as a two-wheeled vehicle, a railway, aircraft, a ship, and other mobile bodies or a mobile terminal, in which an antenna element is required to be shortened.

What is claimed is:

1. A terrestrial broadcast wave reception-use amplifier, comprising:
    a power feeding terminal for connecting to a power feeding point of an antenna element for receiving a terrestrial broadcast wave using a frequency at or below an FM broadcast band; and
    a compound semiconductor high electron mobility transistor for amplifying a received wave having a frequency at or below a resonant point of the antenna element among received waves of the antenna element input through the power feeding terminal, without pursuing gain matching with the antenna element, and a noise figure in connection to the antenna element becomes constant over the entire use frequency band.

2. A terrestrial broadcast wave reception-use amplifier according to claim 1, wherein the antenna element comprises a monopole antenna element having a length of 0.0125-fold of a wavelength of the terrestrial broadcast wave of the FM broadcast band or shorter.

3. A terrestrial broadcast wave reception-use amplifier according to claim 2, wherein the compound semiconductor high electron mobility transistor forms a center of at least one equal noise figure circle coinciding with an impedance at a center of a curvature circle drawn by a complex impedance in a frequency band that is receivable by the monopole antenna element on a Smith chart.

4. A terrestrial broadcast wave reception-use amplifier according to claim 3, wherein a source of the compound semiconductor high electron mobility transistor is connected to a ground, and a gate of the compound semiconductor high electron mobility transistor is supplied with a received wave received by the monopole antenna element via a line having a predetermined impedance and a bias power via a DC blocking circuit and a bias circuit.

5. A terrestrial broadcast wave reception-use amplifier according to claim 4, wherein a source of the compound semiconductor high electron mobility transistor is connected to a ground, a gate of the compound semiconductor high electron mobility transistor is connected to the power feeding terminal via a line having an impedance of 200 Ω or larger, which is lower than an output impedance of the monopole antenna element, and the gate is supplied with a bias power via a DC blocking circuit and a bias circuit.

6. A terrestrial broadcast wave reception-use amplifier according to claim 3, wherein a source of the compound semiconductor high electron mobility transistor is connected to a ground, a gate of the compound semiconductor high electron mobility transistor is connected to the power feeding terminal via a line having an impedance of 200 Ω or larger, which is lower than an output impedance of the monopole antenna element, and the gate is supplied with a bias power via a DC blocking circuit and a bias circuit.

7. A terrestrial broadcast wave reception-use amplifier according to claim 6, wherein a drain of the compound semiconductor high electron mobility transistor is connected to at least one of a first circuit for causing the compound semiconductor high electron mobility transistor to amplify a received wave having a frequency of an AM band and a second circuit for causing the compound semiconductor high electron mobility transistor to amplify a received wave having a frequency of an FM band.

8. A terrestrial broadcast wave reception-use antenna device, comprising:
    an antenna element for receiving a terrestrial broadcast wave using a frequency at or below an FM broadcast band;
    an amplifier including a compound semiconductor high electron mobility transistor for amplifying a received wave having a frequency at or below a resonant point of the antenna element among received waves of the antenna element, without pursuing gain matching with the antenna element, and a noise figure in connection to the antenna element becomes constant over the entire use frequency band; and
    a ground terminal for connecting a ground line of the amplifier to an external ground conductive surface.

9. A terrestrial broadcast wave reception-use antenna device according to claim 8, wherein the amplifier forms a center of at least one equal noise figure circle coinciding with an impedance at a center of a curvature circle drawn by a complex impedance in a frequency band that is receivable by the antenna element having a length of 0.0125-fold of a wavelength of the terrestrial broadcast wave of the FM broadcast band or shorter on a Smith chart.

10. A terrestrial broadcast wave reception-use antenna device according to claim 9, wherein:
    the amplifier is configured so that all electric components are mounted on one side of a wiring board; and
    a ground plate is disposed on a surface of the wiring board on which no component is mounted.

11. A terrestrial broadcast wave reception-use antenna device according to claim 8, wherein:
    the amplifier is configured so that all electric components are mounted on one side of a wiring board; and
    a ground plate is disposed on a surface of the wiring board on which no component is mounted.

* * * * *